United States Patent
Yang et al.

(10) Patent No.: US 12,120,958 B2
(45) Date of Patent: Oct. 15, 2024

(54) METHOD OF MANUFACTURING A CURVED CERAMIC STRUCTURE

(71) Applicant: City University of Hong Kong, Kowloon (HK)

(72) Inventors: Zhengbao Yang, Kowloon (HK); Yao Shan, Kowloon (HK)

(73) Assignee: City University of Hong Kong, Kowloon (HK)

( * ) Notice: Subject to any disclaimer, the term of this patent is extended or adjusted under 35 U.S.C. 154(b) by 723 days.

(21) Appl. No.: 17/164,889

(22) Filed: Feb. 2, 2021

(65) Prior Publication Data
US 2022/0246834 A1 Aug. 4, 2022

(51) Int. Cl.
| | | |
|---|---|---|
| *H10N 30/097* | (2023.01) | |
| *H10N 30/045* | (2023.01) | |
| *H10N 30/08* | (2023.01) | |
| *H10N 30/853* | (2023.01) | |
| *H10N 30/20* | (2023.01) | |

(52) U.S. Cl.
CPC ......... *H10N 30/045* (2023.02); *H10N 30/097* (2023.02); *H10N 30/8536* (2023.02); *H10N 30/8542* (2023.02); *H10N 30/8554* (2023.02); *H10N 30/08* (2023.02); *H10N 30/2048* (2023.02); *Y10T 29/42* (2015.01)

(58) Field of Classification Search
CPC .... Y10T 29/42; H10N 30/045; H10N 30/097; H10N 30/2048; H10N 30/8536; H10N 30/8542; H10N 30/8554
See application file for complete search history.

(56) References Cited

U.S. PATENT DOCUMENTS

| | | | |
|---|---|---|---|
| 5,471,721 A | 12/1995 | Haertling | |
| 5,632,841 A | 5/1997 | Hellbaum et al. | |
| (Continued) | | | |

FOREIGN PATENT DOCUMENTS

JP 2006005071 A * 1/2006

OTHER PUBLICATIONS

Lous et al, "Fabrication of curved ceramic/polymer composite transducer for ultrasonic imaging applications by fused deposition of ceramics," ISAF 1998. Proceedings of the 11th IEEE International Symposium on Applications of Ferroelectrics (Cat. No. 98CH36245), Montreux, Switzerland, 1998, pp. 239-242. (Year: 1998).*

*Primary Examiner* — A. Dexter Tugbang
(74) *Attorney, Agent, or Firm* — Renner, Kenner, Greive, Bobak, Taylor & Weber

(57) ABSTRACT

A method of manufacturing a ceramic structure, a method of manufacturing a ceramic structure with multiple layers of ceramic material, and a method of manufacturing a piezoelectric ceramic structure. The method of manufacturing a ceramic structure includes the steps of: placing a sheet of ceramic material on a supporting platform, wherein the supporting platform is arranged to elevate the sheet of ceramic material from a base of the supporting platform by supporting only a first portion of the sheet of ceramic material; sintering the sheet of ceramic material; and during the step of sintering of the sheet of ceramic material, facilitating forming a curvature on the sheet of ceramic material at a second portion of the sheet of ceramic material which is not supported by the supporting platform.

8 Claims, 13 Drawing Sheets

(56) References Cited

U.S. PATENT DOCUMENTS

| | | | |
|---|---|---|---|
| 5,767,612 A * | 6/1998 | Takeuchi | H10N 30/2048 |
| | | | 310/330 |
| 5,849,125 A | 12/1998 | Clark | |
| 6,329,741 B1 * | 12/2001 | Vartuli | H10N 30/2048 |
| | | | 310/330 |
| 6,396,196 B1 * | 5/2002 | Takeuchi | H10N 30/2048 |
| | | | 310/330 |
| 6,512,323 B2 | 1/2003 | Forck et al. | |
| 7,081,701 B2 | 7/2006 | Yoon et al. | |
| 2002/0059708 A1 * | 5/2002 | Zhang | Y10T 29/42 |
| | | | 29/25.35 |
| 2002/0160904 A1 * | 10/2002 | Sumiya | H10N 30/097 |
| | | | 501/134 |
| 2010/0237751 A1 * | 9/2010 | Bosch | Y10T 29/42 |
| | | | 29/25.35 |
| 2011/0289744 A1 * | 12/2011 | Ohnishi | H10N 30/097 |
| | | | 29/25.35 |
| 2017/0170383 A1 | 6/2017 | Sammoura et al. | |

* cited by examiner

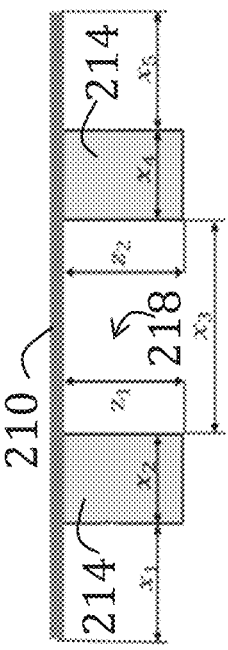
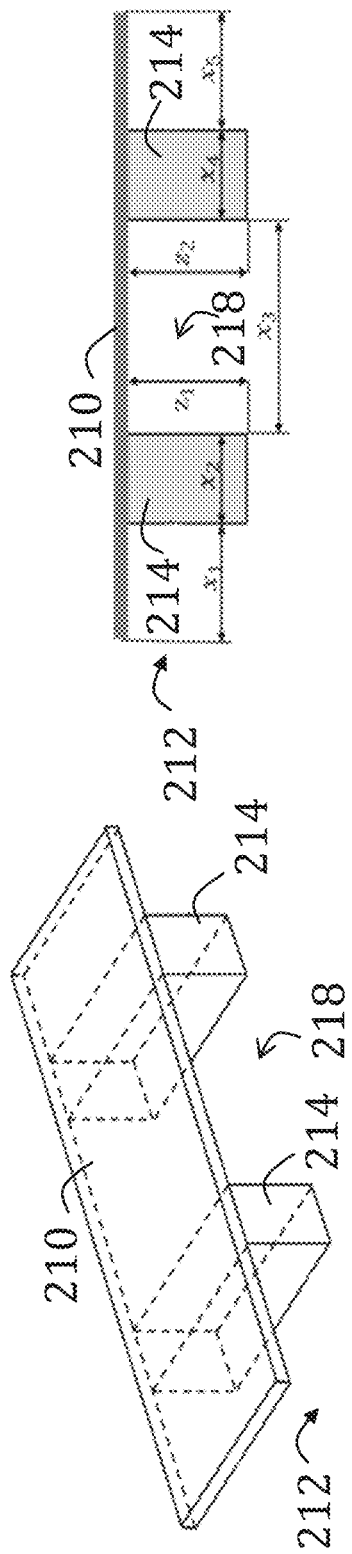
Figure 4
Figure 3

METHOD OF MANUFACTURING A CURVED CERAMIC STRUCTURE

TECHNICAL FIELD

The invention relates to a method of manufacturing a ceramic structure. The invention also relates to a method of manufacturing a ceramic structure with multiple layers of ceramic material, and a piezoelectric ceramic structure.

BACKGROUND

Ceramic is a versatile material due to its wide variety of characteristics. As an example, ceramics exhibiting piezoelectric properties have been widely used in mechatronic devices and smart systems, such as sensors, actuators, and energy harvesting devices, in various industrial fields. They can be used to sense changes in pressure and strain in the environment and can generate electrical responses.

SUMMARY

In a first aspect, there is provided a method of manufacturing a ceramic structure, comprising the steps of: placing a sheet of ceramic material on a supporting platform, wherein the supporting platform is arranged to elevate the sheet of ceramic material from a base of the supporting platform by supporting only a first portion of the sheet of ceramic material; sintering the sheet of ceramic material; and during the step of sintering of the sheet of ceramic material, facilitating forming a curvature on the sheet of ceramic material at a second portion of the sheet of ceramic material which is not supported by the supporting platform.

In one embodiment of the first aspect, during the step of sintering of the sheet of ceramic material, the curvature is formed when the second portion is subjected to an external biasing force.

In one embodiment of the first aspect, the external biasing force includes gravitational force.

In one embodiment of the first aspect, the step of sintering the sheet of ceramic material comprises changing the sheet of ceramic material from a solid state to a quasi-liquid state.

In one embodiment of the first aspect, the method further comprises cooling the sintered sheet of ceramic material to change the sheet of ceramic material from the quasi-liquid state to a solid state.

In one embodiment of the first aspect, the first portion of the sheet of ceramic material comprises opposite end portions of the sheet of ceramic material.

In one embodiment of the first aspect, the second portion of the sheet of ceramic material is between the opposite end portions.

In one embodiment of the first aspect, the supporting platform comprises two support structures with a respective flat surface and a gap between the flat surfaces. The first portion is supported on the flat surfaces, and the second portion is suspended above the gap.

In one embodiment of the first aspect, after the step of sintering of the sheet of ceramic material, the curvature at the second portion is maintained to be suspended.

In one embodiment of the first aspect, the supporting platform comprises two support structures with a respective flat surface and a concave support structure between the flat surfaces. The first portion is supported on the flat surfaces, and the second portion is suspended above the concave support structure.

In one embodiment of the first aspect, during the step of sintering of the sheet of ceramic material, the second portion is facilitated to gradually attach to the concave support structure.

In one embodiment of the first aspect, after the step of sintering of the sheet of ceramic material, the curvature at the second portion is supported by the concave support structure.

In one embodiment of the first aspect, the method further comprises the step of forming the sheet of ceramic material from ceramic powders.

In one embodiment of the first aspect, the step of forming the sheet of ceramic material comprises placing the ceramic powders in a mold and pressing the ceramic powders to obtain the sheet of ceramic material.

In one embodiment of the first aspect, the ceramic material comprises lead zirconate titanate, lead lanthanum zirconate titanate, lead stannate zirconate titanate, lead magnesium niobate-lead titanate, lead zinc niobate-lead titanate, sodium potassium niobate, barium titanate, and barium titanate doped with calcium and zirconium.

In a second aspect, there is provided a method of manufacturing a ceramic structure with multiple layers of ceramic material, comprising the steps of: forming a base ceramic structure defining the concave support structure in accordance with the method in the first aspect; placing an additional sheet of ceramic material on the supporting platform; and sintering the additional sheet of ceramic material thereby forming a curvature on the additional sheet of ceramic material. The curvatures on the base ceramic structure and on the sintered additional sheet of ceramic material are substantial replicates.

In a third aspect, there is provided a method of manufacturing a piezoelectric ceramic structure, comprising the steps of: manufacturing a ceramic structure with a sheet of piezoelectric ceramic material using the method in the first aspect; forming a curvature in a substrate corresponding to the curvature of the sheet of piezoelectric ceramic material; and attaching the substrate onto the sintered sheet of piezoelectric ceramic material.

In one embodiment of the third aspect, the step of forming the curvature in the substrate comprises: placing the substrate on a supporting platform and the sintered sheet of piezoelectric ceramic material, wherein a portion of the substrate is suspended above the curvature of the sheet of piezoelectric ceramic material; heating the substrate; and during the step of heating of the substrate, subjecting the portion of the substrate suspended above the curvature of the sheet of piezoelectric ceramic material to an external biasing force to form the curvature at the portion of the substrate.

In one embodiment of the third aspect, the external biasing force is applied with an external weight.

In one embodiment of the third aspect, during the step of heating of the substrate, the portion of the substrate is facilitated to gradually attach to the curvature of the sheet of piezoelectric ceramic material.

In one embodiment of the third aspect, the portion of the substrate is bonded with the sheet of piezoelectric ceramic material.

In one embodiment of the third aspect, the method further comprises, before attaching the substrate onto the sintered sheet of piezoelectric ceramic material, coating an electrode onto the sintered sheet of piezoelectric ceramic material, and polarizing the electrode and the sintered sheet of piezoelectric ceramic material with an electric field.

In one embodiment of the third aspect, the substrate comprises a thermoplastic polymer.

In one embodiment of the third aspect, the piezoelectric ceramic structure comprises a unimorph or a bimorph.

BRIEF DESCRIPTION OF THE DRAWINGS

Embodiments of the invention will now be described, by way of example, with reference to the accompanying drawings in which:

FIG. 3 is a perspective view of a support platform for use in the method of FIG. 2, with a sheet of ceramic material supported thereon;

FIG. 4 is a front view of the support platform of FIG. 3, with the sheet of ceramic material supported thereon;

DETAILED DESCRIPTION

Figure 1:
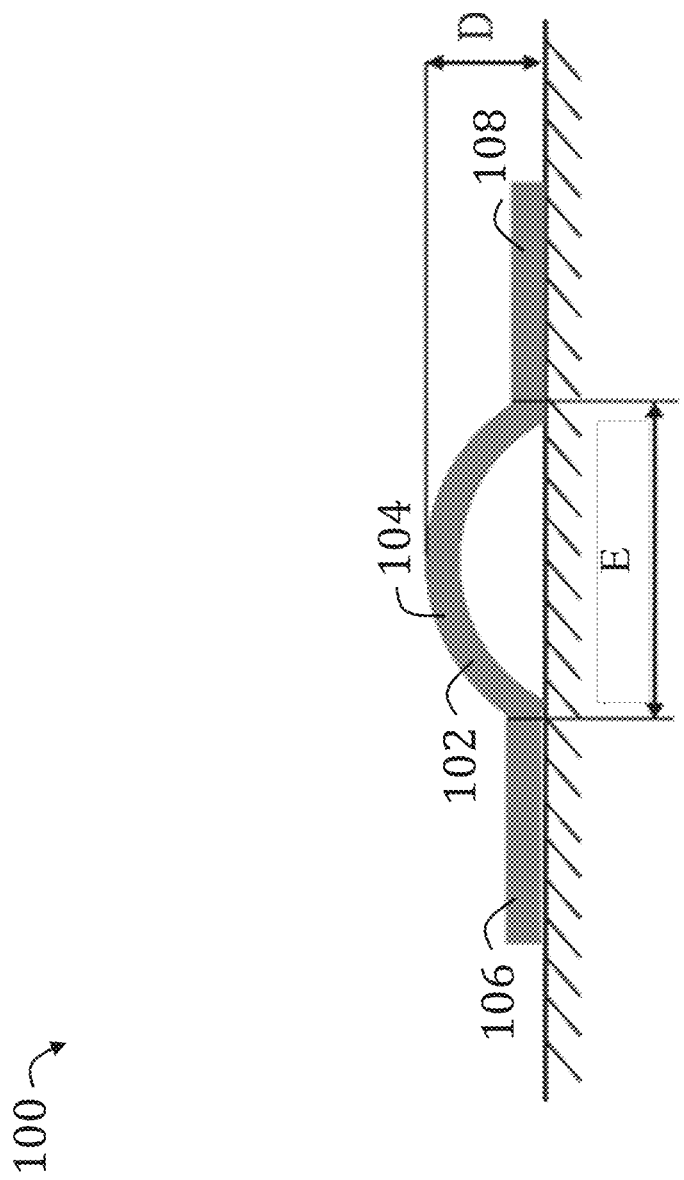
FIG. 1 is a schematic diagram of a ceramic structure in accordance with one embodiment of the invention.

The inventors have, through their own research, trials and experiments, devised that compared with unimorph and bimorph actuators constructed with flat sheets of piezoelectric ceramics, actuators in curved shapes exhibit larger displacement range and deflection owing to the special curved geometry. However, fabricating piezoelectric ceramic materials with desired curvatures and improved actuation performance remains a big challenge. It is difficult to fabricate such curved ceramic actuators by bending these actuators directly because piezoelectric ceramics are brittle and can be easily broken during mechanical manufacturing. Also, the brittle nature of ceramics limits their applications on curved surface and to only small deformations.

The inventors have found that different methods have been developed to fabricate curved ceramic structures based on the mismatch of coefficient of thermal expansion (CTE). For example, a pre-stressed unimorph device called "RAINBOW", which is an acronym for Reduced And Internally Biased Oxide Wafer, has been developed. In this method, the curved shape of RAINBOW devices is due to the volume shrinkage of the reduced material and the unreduced material and the difference in thermal expansion between the mentioned two layers. The suitable reducing agent that will extract oxygen atoms from the surface being reduced can be graphite, carbon monoxide and hydrogen. The curvatures of RAINBOW devices are limited, and this process will result in the introduction of other elements into the piezoelectric material thereby undermining the piezoelectricity of the original material.

Another pre-stressed unimorph called "THUNDER", which is an acronym for thin layer composite unimorph ferroelectric driver and sensor, has been developed. This method employs the mismatch of CTE of metal layers and the lead zirconate titanate (PZT) layer sandwiched between two adhesive layers surrounded by the top thin metal layer and a thicker metal layer on the bottom. PZT ceramic is extremely brittle. Due to this property, the ceramic layers are frequently fractured during the manufacturing of THUNDER actuators when external pressure is applied to the ceramic layer. Similarly, a curved stacked device by heating stacked layers bonded by adhesive and then subsequently cooling to room temperature has been developed.

Also, a method to fabricate such curved actuators by constructing a composite structure with high CTE and low CTE fiber layers has been developed. The principle of generating dome is similar with THUNDER actuator and curved stacked device.

Another method for manufacturing pre-stressed piezoelectric actuators using a pre-curved piece of ceramic has been developed and this method is based on the difference in thermal contraction rates of the materials. The pre-curved ceramic which is cast, machined, molded so as to provide a normally unstressed ceramic layer. And then the pre-curved PZT ceramic is bonded on a pre-stress metal layer by an adhesive. By heating this composite structure to a temperature above the melting point of the adhesive material and then cooled subsequently, the pre-stressed piezoelectric actuators are obtained.

Another method to fabricate curved piezoelectric transducers by using curved support substrate has been developed. This method is used to make self-curved diaphragms by engineering residual stress in thin films. The piezoelectric layer is deposited on a curved substrate to generate curvature.

With reference to FIG. 1, there is shown a ceramic structure 100 in accordance with one embodiment of the invention. The ceramic structure 100 may exhibit piezoelectric properties, allowing it to be used for piezoelectric devices such as sensors, acoustic transducers, actuators and energy harvesters. The ceramic structure 100 includes a single layer having a dome-shaped curvature 102 in a middle portion 104 between two opposite flat end portions 106, 108 of the ceramic structure 100, which facilitates large displacement range and deflection when being used in piezoelectric devices. As illustrated, the width of the curvature 102 defines an effective length E, while the height of the curvature 102 defines a dome height, as will be discussed later.

The ceramic material in the ceramic structure 100 is preferably a piezoelectric ceramic material, and may include lead zirconate titanate (PZT), lead lanthanum zirconate titanate (PLZT), lead stannate zirconate titanate (PSZT), lead magnesium niobate-lead titanate (PMN-PT), lead zinc niobate-lead titanate (PZN-PT), sodium potassium niobate (KNN), and barium titanate (BTO), and barium titanate doped with calcium and zirconium (BCTZ).

Figure 2:
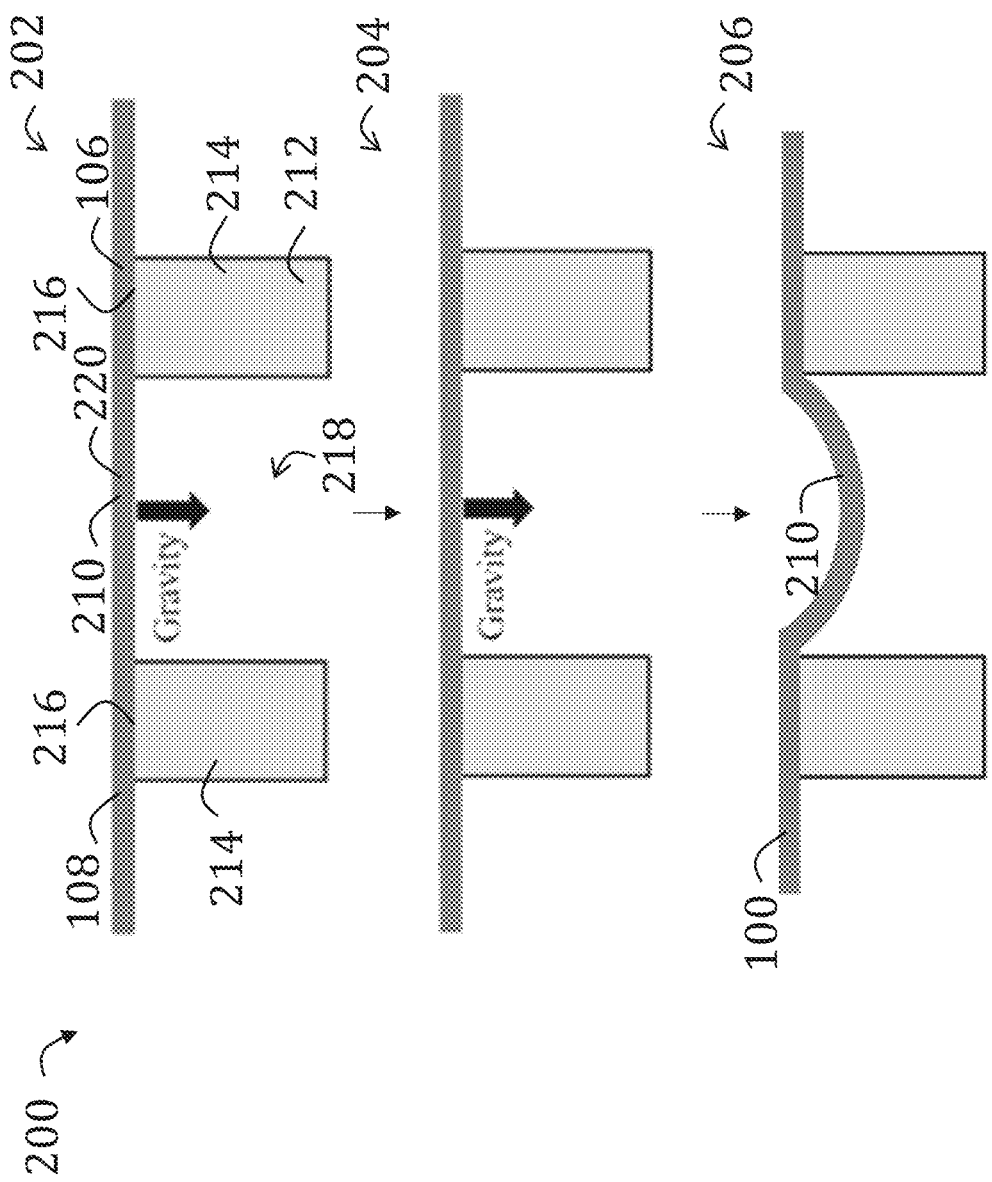
FIG. 2 is a flow diagram illustrating a method of manufacturing the ceramic structure of FIG. 1.

Referring to FIGS. 2 and 3, there is shown a method 200 of manufacturing the ceramic structure 100. Generally, the curved ceramic structure 100 is fabricated by a one-step method, with the effect of an external biasing force, more particularly a gravitational force. The method 200 starts in step 202, in which a flat sheet of ceramic material 210 is placed on a supporting platform 212. The sheet-like ceramic material 210 may be prepared by placing ceramic powders in a mold and applying pressure (e.g. pressing) depending on a predetermined size of the sheet 210, thus the sheet of ceramic material 210 may be referred to as a "green compact".

Different from conventional supporting systems having a flat platform for supporting all segments of the green compact such that the effect of gravity is fully offset by the reaction force of the platform, the illustrated supporting platform 212 includes two support structures 214 with a respective flat surface 216 and a gap 218 between the flat surfaces 216. The supporting platform 212 elevates the sheet of ceramic material 210 from a base of the supporting platform 212 by supporting only a first portion of the sheet of ceramic material 210 (i.e., the opposite end portions 106, 108 of the sheet 210) on the flat surfaces 216. A second middle portion 220 of the sheet of ceramic material 210 which is not supported by the supporting platform 212 and suspended above the gap 218 remains flat under the effect of gravity.

The supporting platform 212 is preferably made of a durable material, such as alumina, which has a negligible coefficient of thermal expansion and high-temperature resistance. The size of the supporting platform 212 may be selected based on the size of the sheet of ceramic material placed thereon.

The method 200 then proceeds to step 204, in which the sheet of ceramic material 210 is sintered by heat in a furnace without melting to the point of liquefaction, with the introduction of the effect of the gravitational force. The sintering process may additionally be performed with applying a pressure to the sheet of ceramic material 210.

During step 204, the middle portion 220 of the sheet 210 is subjected to the external biasing force, and the curvature 102 is facilitated to be formed on the sheet of ceramic material 210, between the two flat end portions 106, 108. The sheet of ceramic material 210 may be changed and transformed from a brittle solid state to a quasi-liquid state during step 204, e.g. when being heated to near sintering temperature of the ceramic material, resulting in a non-uniform distribution of force on the compact 210, thus causing the second portion 220 of the sheet of ceramic material 210 to become curved under the effect of gravity. The sintering temperature may be dependent on the type of ceramic materials.

In step 206, after the sintering process, the sheet of ceramic material 210 with the curvature 102 is cooled to change from the quasi-liquid state, densify and crystallize to a solid state, to form the ceramic structure 100. The curvature 102 at the second portion 220 is maintained to be suspended from the supporting platform 212.

FIG. 4 shows different parameters of the supporting platform 212 that, when modified, allow the curvature 102 (e.g. including the dome height D and the effective length E) of the curved ceramic structure 100 to be highly controllable and easily tuned. The parameters $x_1$, $x_2$, $x_3$, $x_4$, $x_5$, $z_1$, and $z_2$ have effects on the formation of the curvature 102. In one example, the values of $x_2$, $x_4$, $z_1$, and $z_2$ are fixed and the value of $x_1$ is set to equal the value of $x_5$.

Figure 5B:
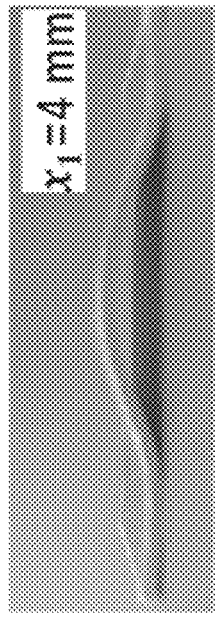
FIG. 5B is an image of another example ceramic structure with a second curvature.
Figure 5A:
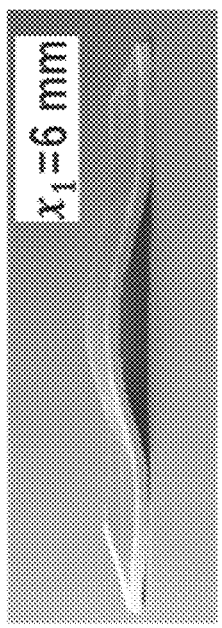
FIG. 5A is an image of an example ceramic structure with a first curvature.

FIGS. 5A and 5B show the curved ceramic structures 100 with different curvatures 102 obtained by using the method 200. No defects are observed in the respective curved segments 102 and the respective interfaces between the curved segment 102 and the flat segments 106, 108, demonstrating the practicability of the method 200.

Figure 6:
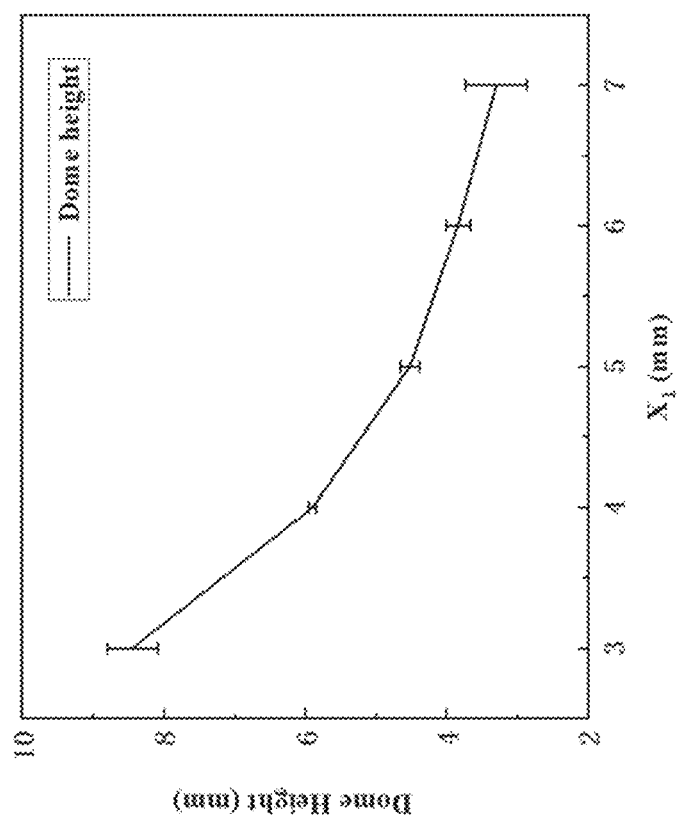
FIG. 6 is a graph showing the relation of dome height of a ceramic structure to a parameter of the support platform.

As discussed, the dome heights D of the ceramic structure 100 can be tuned by modifying the parameters of the supporting platform 212. FIG. 6 shows the relation of the dome heights of different curved ceramic structures versus parameter $x_1$. The relation curve and slight error bars of each group demonstrate the tunability and repeatability of the curved ceramic structures obtained using the method 200. Besides, the dome height D has a positive but not linear relation with the effective length E. The liquid-like sample starts bending when the initial equilibrium between the gravity and the internal shear force is broken, and then a new equilibrium is established corresponding to the geometry of the final curved ceramic structure.

Figure 7C:
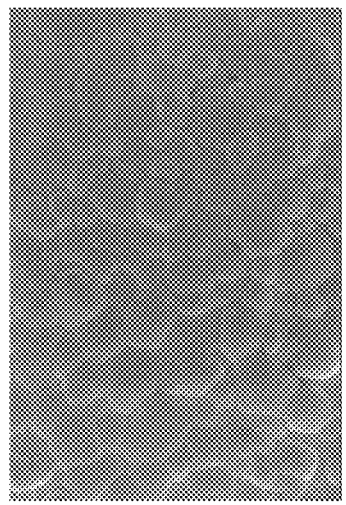
FIG. 7C is a scanning electron microscope (SEM) image of another curved ceramic structure.
Figure 7B:
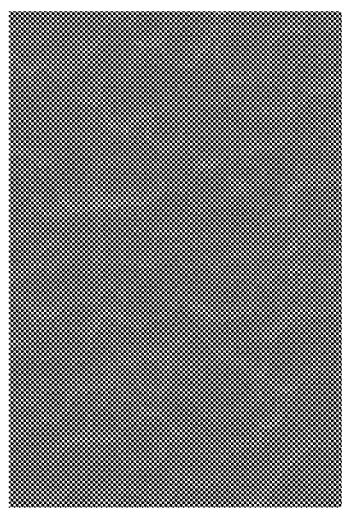
FIG. 7B is a scanning electron microscope (SEM) image of a curved ceramic structure.
Figure 7A:
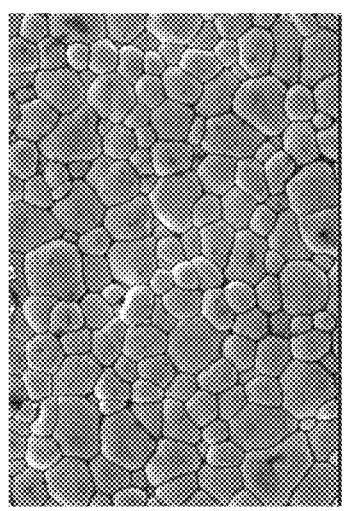
FIG. 7A is a scanning electron microscope (SEM) image of a flat ceramic structure.
Figure 8:
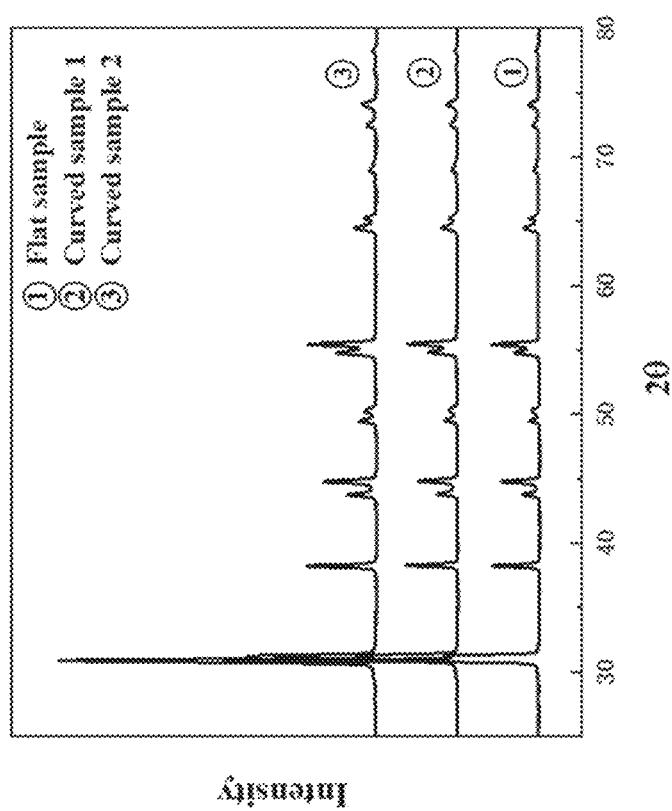
FIG. 8 shows the X-ray diffraction (XRD) patterns of the flat ceramic structure and the curved ceramic structures in FIG. 7A to 7C respectively.

FIG. 7A to 7C show the scanning electron microscope (SEM) images of the surfaces of a flat PZT ceramic, a curved PZT sample 1 prepared using the method 200, and a curved PZT sample 2 prepared using the method 200 but with a different supporting platform to the curved PZT sample 1. The SEM results show that both curved samples and the flat sample are perfectly crystallized without obvious pores or cracks. As shown in FIG. 8, the curved samples and the flat sample have the same diffraction peak distribution in the X-ray diffraction (XRD) patterns, which demonstrates that the three PZT ceramic samples possess the same perovskite phase structure. The SEM and XRD results indicate the special supporting method in the invention has negligible influences on the microstructure formation of the ceramic structure during sintering.

Figure 9:
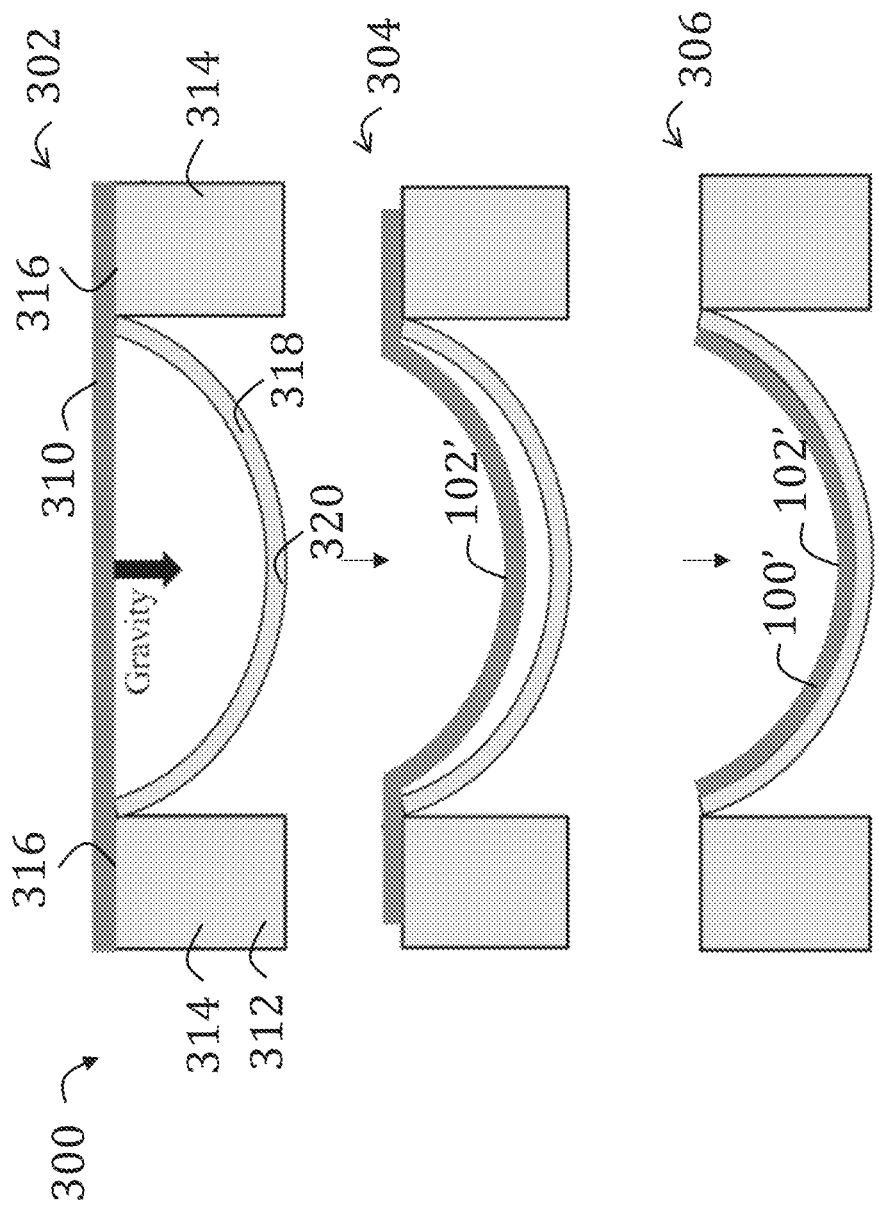
FIG. 9 is a flow diagram illustrating a method of manufacturing a ceramic structure in accordance with one embodiment of the invention.

Referring to FIGS. 9, there is shown an alternative method 300 of manufacturing a ceramic structure 100', particularly a ceramic structure with a predetermined curvature 102'. The method 300 is very similar to the method 200, in which the curved ceramic structure 100' is also fabricated by a one-step method, utilizing the state transformation of a green compact during the sintering process and the effect of gravity. The following description mainly focuses on the different between the methods 200 and 300, which lies in the structure of the supporting platform.

The supporting platform 312 used in the method 300 includes two support structures 314 with a respective flat surface 316 and a concave support structure 318 with a predetermined curvature 320 corresponding to the predetermined curvature 102' of the ceramic structure 100' between the flat surfaces 316. The concave support structure 318 may also be made of alumina.

In step 304, during the step of sintering where the sheet of ceramic material 310 is transformed into a quasi-liquid state, the liquid-like sheet 310 gradually attaches onto the surface of the concave support structure 318 as a result of the gravitational force, thus achieving the predetermined curvature 102'.

In step 306, after the sintering process, the sheet of ceramic material 310 is cooled and fully densifies and crystallizes, obtaining a ceramic structure 100' with the desired predetermined curvature 102' supported by the concave support structure 318.

Figure 10:
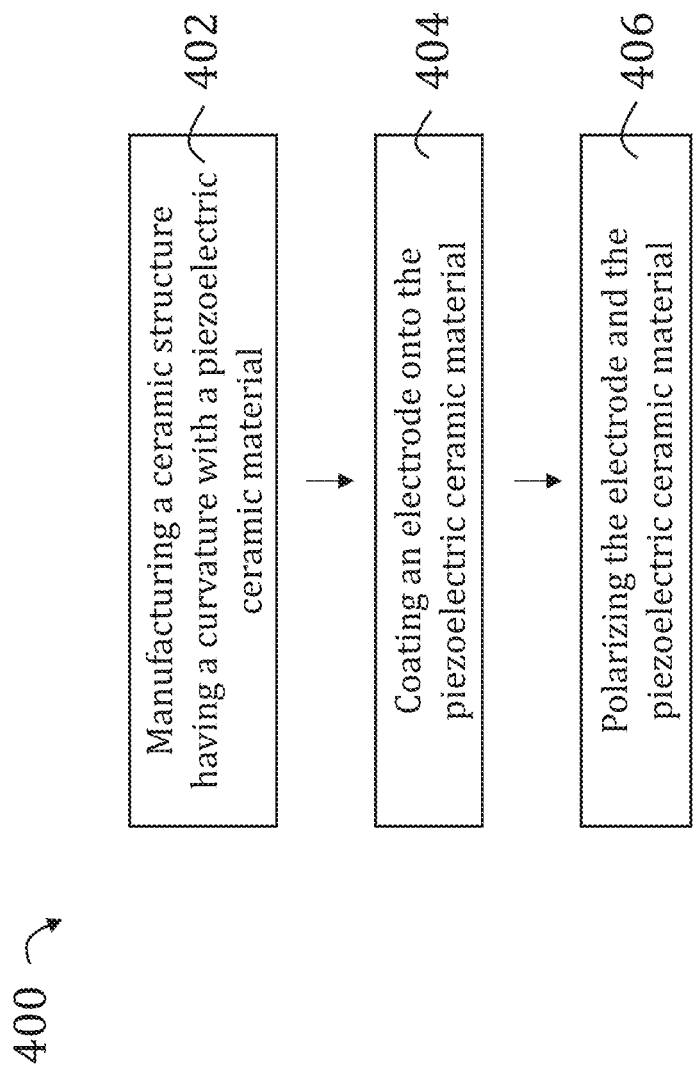
FIG. 10 is a flow diagram illustrating a method of manufacturing a piezoelectric ceramic structure in accordance with one embodiment of the invention.

As discussed, the ceramic structures 100, 100' may be used in various applications such as piezoelectric devices. FIG. 10 shows a method 400 of manufacturing a piezoelectric ceramic structure. The method 400 starts in step 402, in which a ceramic structure having a curvature is manufactured with a sheet of piezoelectric ceramic material. Preferably, the ceramic structure is manufactured using the method 200 or the method 300. Then, in step 404, an electrode is coated onto the surface of the sheet of piezoelectric ceramic material. The electrode may be made of any conductive material (e.g. silver) with any thickness, and may be coated using a sputtering process. In step 406, the electrode and the sheet of piezoelectric ceramic material are polarized with an electric field, depending on the thickness of the piezoelectric ceramic structure, to achieve the desired piezoelectric effects.

In one example embodiment of the invention, a sheet of ceramic material is prepared using PZT. The commercialized PZT powders of 60/40 (Zr/Ti) are mixed with the polyvinyl alcohol (PVA: 5 wt %) solution, stirred evenly, and then pressed in a steel mold at 20 MPa to obtain a rectangle PZT compact with a side length, a side width and a thickness of 80 mm, 30 mm and 1.15 mm, respectively. Then, the green compact is placed on the supporting platform having two supporting structures made by alumina (99.9% purity). The sizes of the two alumina supporting structures are the same with a side length of 50 mm, a side width of 20 mm, and a side height of 18 mm.

The green compact PZT and the supporting platform are then located in an alumina (99.9% purity) crucible and then sealed and placed in a furnace for sintering. For PZT, the sintering temperature setup is as follows:
 (1) heating from room temperature to 650° C. with a heating rate of 5° C./min
 (2) maintaining 650° C. for 2 hours to expel polyvinyl alcohol (PVA) binder
 (3) heating from 650° C. to 1200° C. with a heating rate of 5° C./min
 (4) maintaining 1200° C. for 2 hours for crystallization and densification
 (5) cooling to room temperature with the furnace.

Then, the surface of the obtained ceramic structure is cleaned using an ultrasonic cleaning system. Silver electrodes are then coated on the surface of the cleaned curved PZT ceramic using a dual target sputtering system. The curved PZT ceramic and the electrodes are then immersed in silicone oil at a temperature of 85° C. and poled with an electric field of 3 kV/cm.

Figure 11:
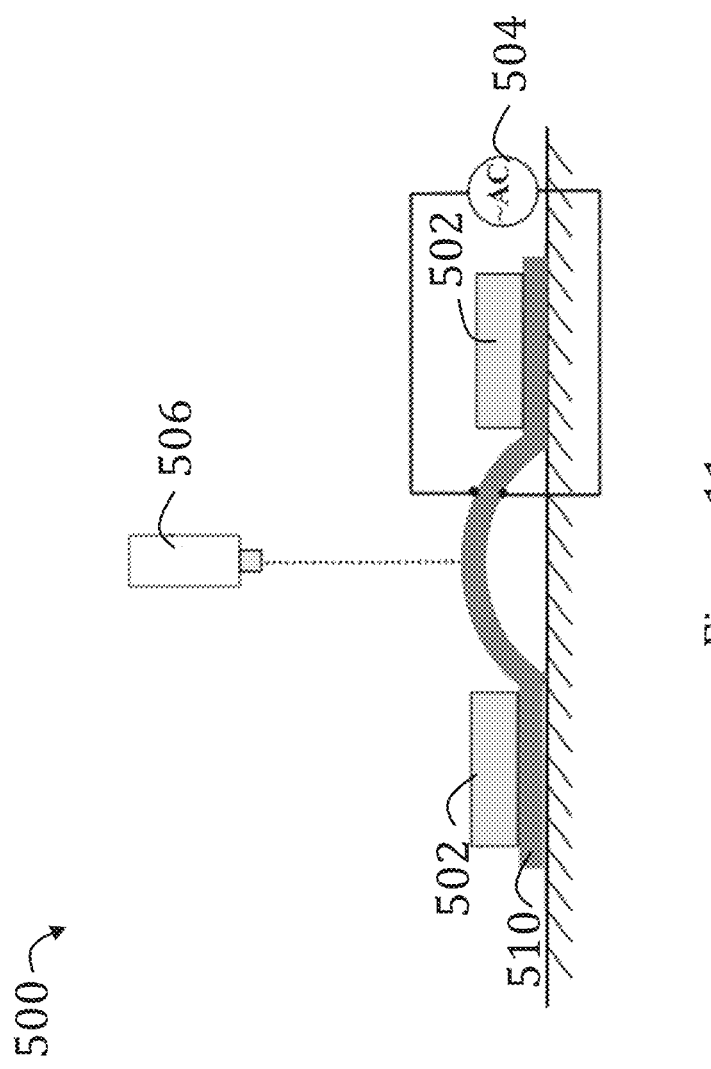
FIG. 11 is a schematic diagram of a system for evaluating actuation performance of a piezoelectric ceramic structure manufactured using the method of FIG. 10.

FIG. 11 shows a testing system 500 for measuring actuation performance of a piezoelectric ceramic structure 510, such as one prepared using the method 400. The testing system 500 includes two blocks 502 for securing the piezoelectric ceramic structure, an alternating current (AC) power supply 504 for providing a sinusoidal voltage input, and a compact laser vibrometer 506 for measuring the displacement output of the ceramic structure.

Figure 13:
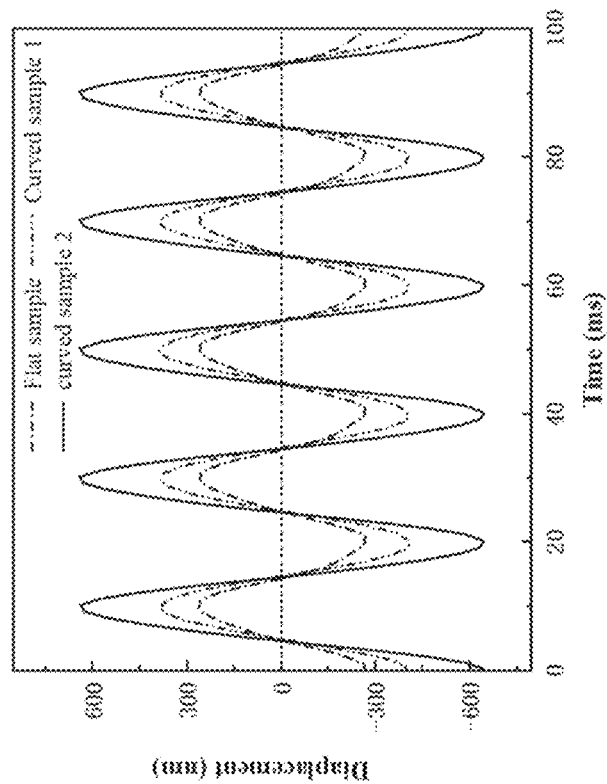
FIG. 13 shows the comparison of displacement responses of the flat ceramic structure and the curved ceramic structures in FIG. 7A to 7C respectively under the same AC input voltage.
Figure 12:
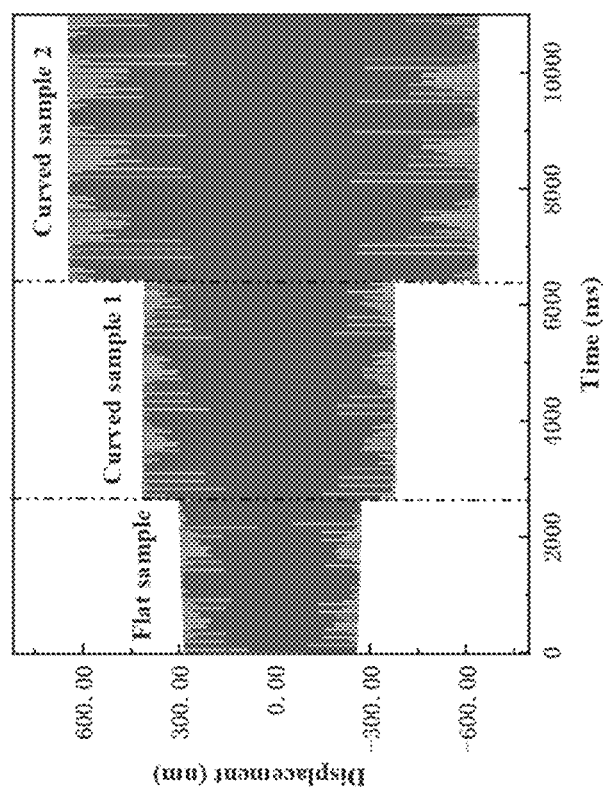
FIG. 12 shows the comparison of displacement responses of the flat ceramic structure and the curved ceramic structures in FIG. 7A to 7C respectively under the same AC input voltage.

FIGS. 12 and 13 demonstrate the comparison of displacement of the flat ceramic sample and the two curved ceramic samples in FIGS. 7A to 7C which exhibit a piezoelectric effect under the same boundary condition and excitation voltage of a frequency of 50 Hz and an amplitude of 200 V. It is shown that the displacement outputs of curved samples are higher than the flat sample. Also, the five periods of the output signals of the three samples demonstrate that the responses exhibit low noise, stability and repeatability.

Figure 15:
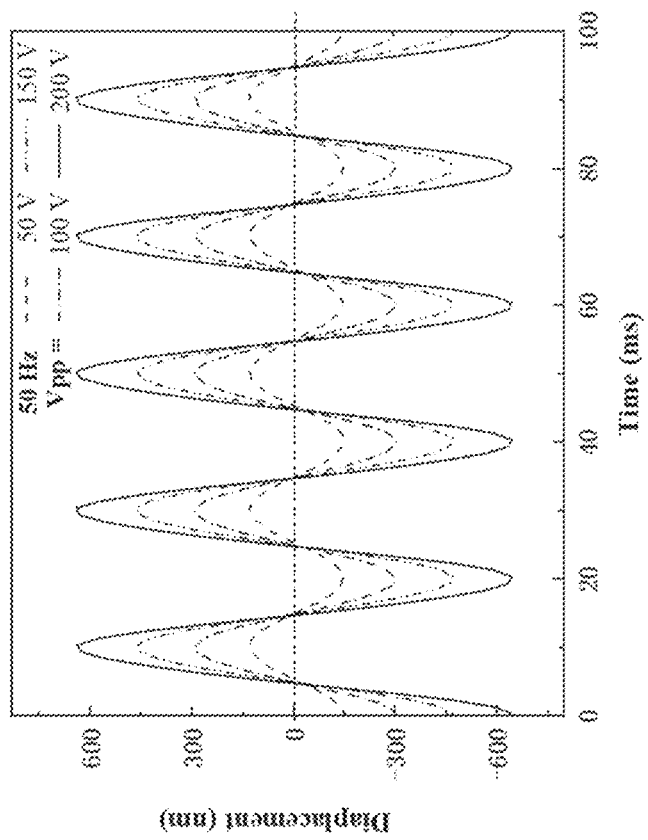
FIG. 15 shows the displacement response of the curved ceramic structure of FIG. 7C under diverse voltages.
Figure 14:
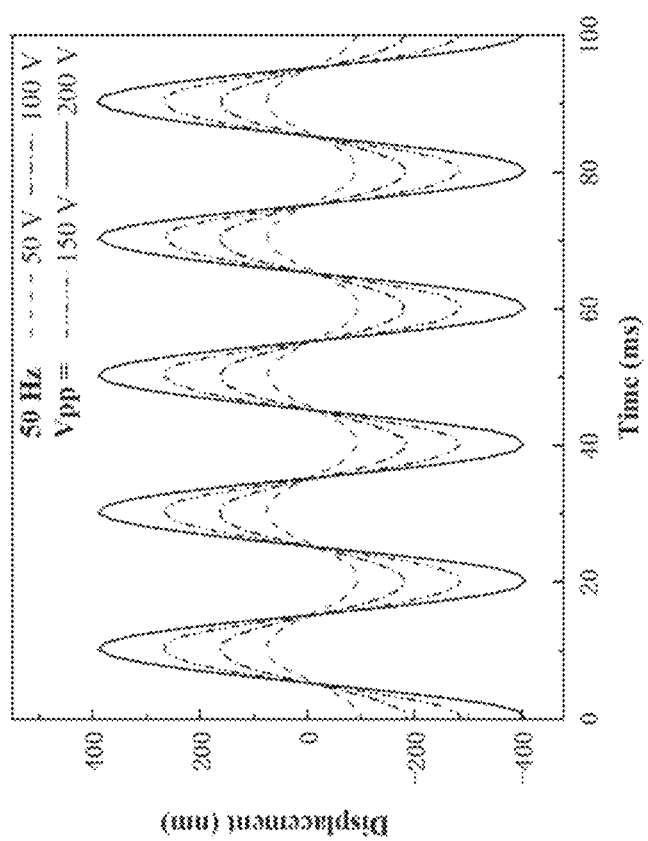
FIG. 14 shows the displacement response of the curved ceramic structure of FIG. 7B under diverse voltages.

FIGS. 14 and 15 show the displacement responses of two curved samples under different driving voltages. The perfect sinusoidal output signals denote that the responses are controllable.

Figure 16:
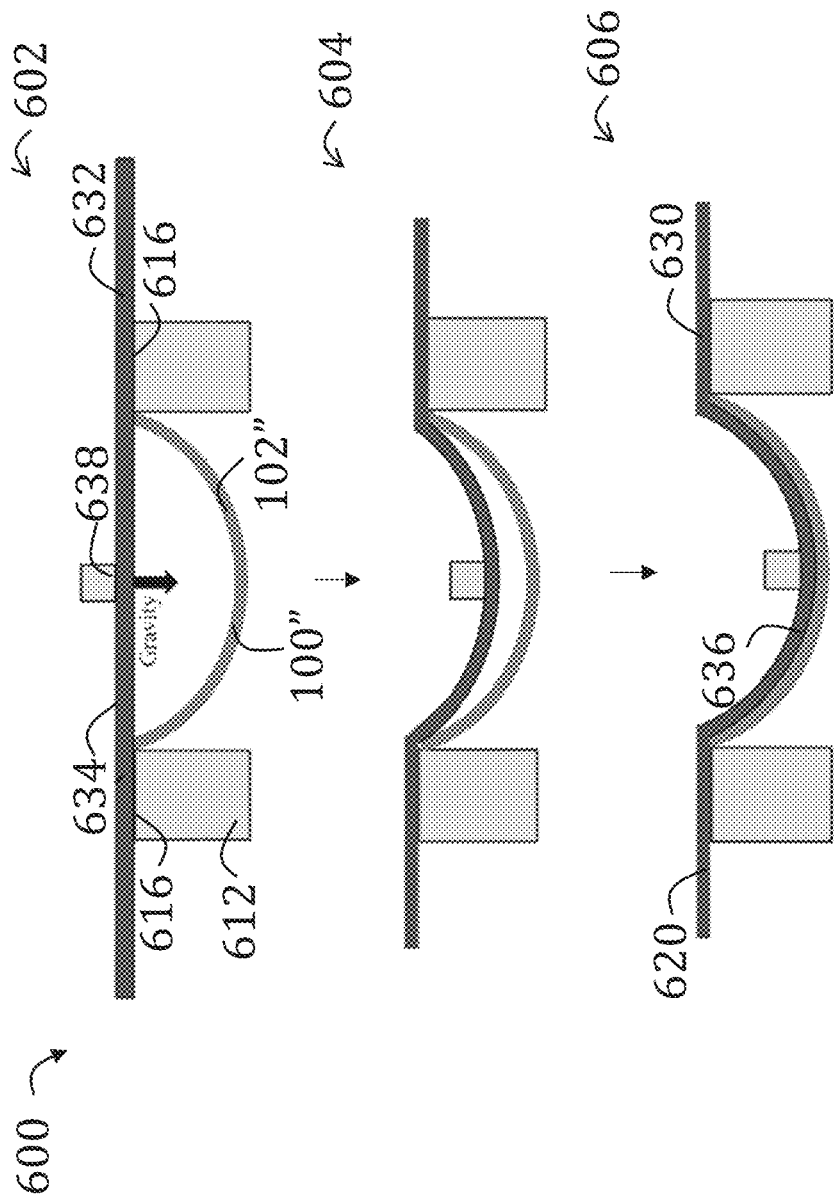
FIG. 16 is a flow diagram illustrating a method of manufacturing a piezoelectric ceramic structure in accordance with one embodiment of the invention.

FIG. 16 shows a method 600 of manufacturing another piezoelectric ceramic structure 620 having a curved substrate 630. For example, the piezoelectric ceramic structure 620 may be utilized in a piezoelectric device such as a curved piezo unimorph or bimorph actuation elements. The curved substrate 630 is preferably made of a shape-transformable material, such as a thermoplastic polymer. Similar to the methods 200, 300, the piezoelectric ceramic structure 620 is prepared using a supporting platform 612.

The method 600 starts in step 602, in which a flat sheet of substrate 632 is placed and supported on flat surfaces 616 of the supporting platform 612. The supporting platform 612 is attached to a curved ceramic structure 100", such as one prepared using the method 200 or 300. The middle portion 634 of the substrate 632 is suspended above the curvature 102" of the ceramic structure 100".

In step 604, the sheet of substrate 632 is heated at a temperature significantly lower than the liquefaction temperature of the ceramic structure 100", such that the ceramic structure 100" will not deform, while the middle portion 634 of the substrate 632 is subjected to an external force to form the curvature 636 in the middle portion 634 of the substrate 632. As illustrated, the external force is applied with an external weight 638 placed on the surface of the sheet of substrate 632 and exerting a downward force on the substrate 632. The external weight 638 is particularly useful to work as an external force source since the effect of gravity of the sheet of substrate 632 is insufficient to generate the desired deformation. The external weight 638 is preferably an alumina block.

Together with the external force, the heating process causes the thermoplastic substrate 632 to become curved and attach on the surface of the supporting platform 612 gradually, with the curvature 636 of the substrate 630 corresponding to the curvature 102" of the ceramic structure 100".

Similar to the method of 400, after obtaining the desired curvature 636 in the substrate 630, the method 600 then proceeds to the steps of coating electrodes on the surface of the curved ceramic structure 100" and polarizing the electrodes and the curved ceramic structure 100" with an electric field. The method 600 then ends in the step of attaching (such as bonding) the curved substrate 630, particularly the curved portion 636, to the curved ceramic structure 100" and the electrodes.

The above embodiments of the invention have provided methods of manufacturing a ceramic structure and a piezoelectric ceramic structure with the curvatures caused by the gravity impact and the solid to quasi-liquid state change of the green compacts during sintering. The manufactured curved ceramic structures may be used on various curved surfaces such as tubes and tires. The one-step fabrication method for a ceramic structure is economically friendly and energy-efficient as the curved ceramic structures can be obtained without reheating or precise mechanical processing. Also, the curved ceramic structures fabricated in the above embodiments are reliable, repeatable and are characterized with high tunability and large range of curvature. Compared with other methods known in the art using mechanical processing and other post-processing, the materials and thicknesses of the electrodes used in the invention are highly designable as the electrodes are coated on the piezoelectric ceramic structures after the formation of the curve.

It will be appreciated by persons skilled in the art that numerous variations and/or modifications may be made to the invention as shown in the specific embodiments without departing from the spirit or scope of the invention as broadly described. The illustrated curved ceramic structures may be manufactured using a method other than those illustrated. Likewise, the illustrated methods may be used to manufacture a different curved ceramic structure.

For example, although the illustrated ceramic structure includes only a single layer, the methods in the above embodiments (e.g. the method 300) may be used to manufacture a ceramic structure with multiple layers of ceramic material. For example, a base ceramic structure defining the concave support structure in the method 300 may first be formed. An additional sheet of ceramic material may then be placed on the supporting platform, and then sintered thereby forming a curvature on the additional sheet. This allows formation of substantial replicates of curvatures on the base ceramic structure and on the sintered additional sheet of ceramic material.

The curved ceramic structure may have a different structure than those illustrated. For example, the curvature may be present in the end portions of the sheet of ceramic material. There may be more than one curved portions in the ceramic structure. The ceramic structure may have a shape other than a rectangular shape.

The supporting platform may have a different structure than those illustrated. For example, the supporting platform may be configured to support another portion of the sheet of ceramic material, e.g. the middle portion such that the opposite end portions are subjected to the gravitational force instead. The supporting platform may include only one supporting structure that supports the end portions, e.g. a ring-shaped supporting structure.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method of manufacturing a curved piezoelectric ceramic structure, comprising the steps of:

mixing lead zirconate titanate powder with a binder to provide a mixture;
pressing the mixture into a sheet;
providing a supporting platform with at least one support structure and a base, the at least one support structure elevated from the base;
placing at least one first portion of the sheet on the at least one support structure such that a second portion of the sheet is not supported by the at least one support structure;
heating the sheet and at least the supporting platform to expel the binder from the sheet;
sintering the sheet; and
during the step of sintering of the sheet, allowing bending under self-weight of the sheet to form a curvature on the second portion.

2. The method according to claim 1, wherein the binder comprises polyvinyl alcohol at approximately 5 wt % of the mixture.

3. The method according to claim 1, wherein the sheet is flat, the at least one first portion of the sheet comprises opposite end portions of the sheet, the second portion of the sheet is between the opposite end portions, the at least one support structure comprises two support structures, each support structure having a respective flat surface such that the flat surfaces are coplanar and horizontal, a gap extends between the flat surfaces, and wherein, after the placing step, respective ones of the opposite end portions are supported on respective ones of the flat surfaces, and the second portion is suspended above the gap.

4. The method according to claim 3, wherein after the step of sintering of the sheet, the curvature at the second portion is maintained and the second portion is maintained suspended above the gap.

5. The method according to claim 3, further comprising a concave support structure fixed below the gap between the flat surfaces, and wherein, after the placing step, the second portion is suspended above the concave support structure.

6. The method according to claim 5, wherein during the step of sintering of the sheet, the second portion is allowed, during the bending, to gradually attach to the concave support structure.

7. The method according to claim 6, wherein after the step of sintering of the sheet the second portion is supported by the concave support structure.

8. The method according to claim 1, wherein the step pressing the mixture is performed in a mold and forms a single flat layer.

* * * * *